United States Patent
He et al.

(10) Patent No.: US 11,586,071 B2
(45) Date of Patent: Feb. 21, 2023

(54) DRIVE BACKBOARD, MANUFACTURING METHOD THEREOF AND BACKLIGHT MODULE

(71) Applicants: Hefei Xinsheng Optoelectronics Technology Co., Ltd., Anhui (CN); BOE Technology Group Co., Ltd., Beijing (CN)

(72) Inventors: Min He, Beijing (CN); Xiaodong Xie, Beijing (CN); Jing Wang, Beijing (CN); Tianyu Zhang, Beijing (CN); Tengfei Zhong, Beijing (CN); Xue Zhao, Beijing (CN); Ting Zeng, Beijing (CN)

(73) Assignees: Hefei Xinsheng Optoelectronics Technology Co., Ltd., Hefei (CN); BOE Technology Group Co. Ltd., Beijing (CN)

( * ) Notice: Subject to any disclaimer, the term of this patent is extended or adjusted under 35 U.S.C. 154(b) by 170 days.

(21) Appl. No.: 17/216,793

(22) Filed: Mar. 30, 2021

(65) Prior Publication Data
US 2022/0035204 A1  Feb. 3, 2022

(30) Foreign Application Priority Data
Jul. 28, 2020  (CN) .......................... 202010740440.6

(51) Int. Cl.
*G02F 1/1335* (2006.01)
*G02F 1/13357* (2006.01)
(Continued)

(52) U.S. Cl.
CPC .. *G02F 1/133612* (2021.01); *G02F 1/133603* (2013.01); *G02F 1/133608* (2013.01);
(Continued)

(58) Field of Classification Search
CPC ...... G06T 19/006; G02B 5/32; G02B 27/017; G02B 27/4205; G02B 27/0172;
(Continued)

(56) References Cited

U.S. PATENT DOCUMENTS

| | | | |
|---|---|---|---|
| 2013/0112977 A1* | 5/2013 | Kao | H01L 27/124 |
| | | | 257/E33.012 |
| 2019/0295982 A1* | 9/2019 | Hu | H01L 24/32 |
| 2022/0254865 A1* | 8/2022 | Qu | H01L 27/1244 |

* cited by examiner

*Primary Examiner* — Tracie Y Green
(74) *Attorney, Agent, or Firm* — ArentFox Schiff LLP; Michael Fainberg

(57) ABSTRACT

A drive backboard includes: a first conductive layer including bonding pins and first connecting lines, an insulating layer including first via holes and second via holes, a second conductive layer including connecting electrodes and second connecting lines and a conductive protective layer including first protective structures and second protective structures. The first via hole exposes the bonding pin, one end of a first connecting line electrically connects a bonding pin, and the other end reaches the second via hole. One end of a second connecting line electrically connects a connecting electrode, and the other end electrically connects the first connecting line through the second via hole. The first protective structure covers the bonding pin, and the second protective structure covers the second connecting line formed at the position of the second via hole. The pattern of the conductive protective layer is complementary to the pattern of the insulating layer.

20 Claims, 8 Drawing Sheets

(51) Int. Cl.
*H05K 1/11* (2006.01)
*H05K 3/46* (2006.01)
(52) U.S. Cl.
CPC .............. *H05K 1/111* (2013.01); *H05K 1/115* (2013.01); *H05K 3/465* (2013.01); *H05K 2201/10106* (2013.01)
(58) Field of Classification Search
CPC ............ G02B 2027/0178; G02B 5/005; G02B 27/0075; G06F 3/011
See application file for complete search history.

DRIVE BACKBOARD, MANUFACTURING METHOD THEREOF AND BACKLIGHT MODULE

CROSS REFERENCE TO RELATED APPLICATIONS

This application is based on and claims priority under 35 U.S.C 119 to Chinese Patent Application No. 202010740440.6, filed on Jul. 28, 2020, in the China National Intellectual Property Administration. The entire disclosure of the above application is incorporated herein by reference.

FIELD

The disclosure relates to the technical field of display, in particular to a drive backboard, a manufacturing method thereof, a backlight module and a display device.

BACKGROUND

For large-sized liquid crystal displays (LCDs), the luminous efficiency of the edge-lit backlighting solution is difficult to meet the display requirements, so direct-lit backlighting solution is usually adopted for large-sized LCDs.

Since mini light emitting diodes (Mini LEDs) have such advantages as thinness and achievable high contrast ratio, the mini LEDs serve as a backlight in most direct-lit backlighting solutions. However, the manufacturing process of the drive backboard for driving the mini LEDs to emit light is complicated and involves a lot of masks, leading to a relatively high manufacturing cost.

SUMMARY

Embodiments of the disclosure provide a drive backboard, a manufacturing method thereof, a backlight module and a display device.

In a first aspect, embodiments of the disclosure provide a drive backboard, including: a substrate; a first conductive layer on the substrate; an insulating layer on a side, facing away from the substrate, of the first conductive layer; a second conductive layer on a side, facing away from the substrate, of the insulating layer; and a conductive protective layer on a side, facing away from the substrate, of the second conductive layer. The first conductive layer includes a plurality of bonding pins and a plurality of first connecting lines. The insulating layer includes a plurality of first via holes and a plurality of second via holes. The plurality of first via holes expose the plurality of bonding pins. One end of a first connecting line is electrically connected with a bonding pin, and other end of the first connecting line reaches a second via hole. The second conductive layer includes a plurality of connecting electrodes and a plurality of second connecting lines. One end of a second connecting line is electrically connected with a connecting electrode, and other end of the second connecting line is electrically connected with the first connecting line through the second via hole. The conductive protective layer includes a plurality of first protective structures and a plurality of second protective structures. The first protective structure covers the bonding pin exposed by the first via hole, and the second protective structure covers the second connecting line formed at the position of the second via hole. The pattern of the conductive protective layer is complementary to the pattern of the insulating layer.

In a second aspect, embodiments of the disclosure provide a backlight module, including: a drive backboard, a plurality of light emitting diodes, and a driver chip. The drive backboard includes: a substrate; a first conductive layer on the substrate; an insulating layer on a side, facing away from the substrate, of the first conductive layer; a second conductive layer on a side, facing away from the substrate, of the insulating layer; and a conductive protective layer on a side, facing away from the substrate, of the second conductive layer. The first conductive layer includes a plurality of bonding pins and a plurality of first connecting lines. The insulating layer includes a plurality of first via holes and a plurality of second via holes. The plurality of first via holes expose the plurality of bonding pins. One end of a first connecting line is electrically connected with a bonding pin, and other end of the first connecting line reaches a second via hole. The second conductive layer includes a plurality of connecting electrodes and a plurality of second connecting lines. One end of a second connecting line is electrically connected with a connecting electrode, and other end of the second connecting line is electrically connected with the first connecting line through the second via hole. The conductive protective layer includes a plurality of first protective structures and a plurality of second protective structures. The first protective structure covers the bonding pin exposed by the first via hole, and the second protective structure covers the second connecting line formed at the position of the second via hole. The pattern of the conductive protective layer is complementary to the pattern of the insulating layer. The light emitting diode is electrically connected with the connecting electrode of the drive backboard. The driver chip is electrically connected with the bonding pin of the drive backboard.

In a third aspect, embodiments of the disclosure further provide a manufacturing method of the above drive backboard. The method includes: forming a first conductive layer on the substrate, and patterning the first conductive layer, to obtain a plurality of bonding pins and a plurality of first connecting lines; forming an insulating layer on the first conductive layer, and patterning the insulating layer with a first mask, to obtain a plurality of first via holes and a plurality of second via holes; forming a second conductive layer on the insulating layer, and patterning the second conductive layer, to obtain a plurality of connecting electrodes and a plurality of second connecting lines; and forming a conductive protective layer on the second conductive layer, and patterning the conductive protective layer with the first mask, to obtain a plurality of first protective structures and a plurality of second protective structures.

DETAILED DESCRIPTION OF THE EMBODIMENTS

Embodiments of the disclosure provide a drive backboard, a manufacturing method thereof, a backlight module and a display device.

The drive backboard, the manufacturing method thereof, the backlight module and the display device provided in embodiments of the disclosure will be described in detail below in combination with accompanying drawings. The thickness and shape of each film layer in the accompanying drawings do not reflect true proportions, merely aiming at schematically illustrating the contents of the disclosure.

Figure 1:
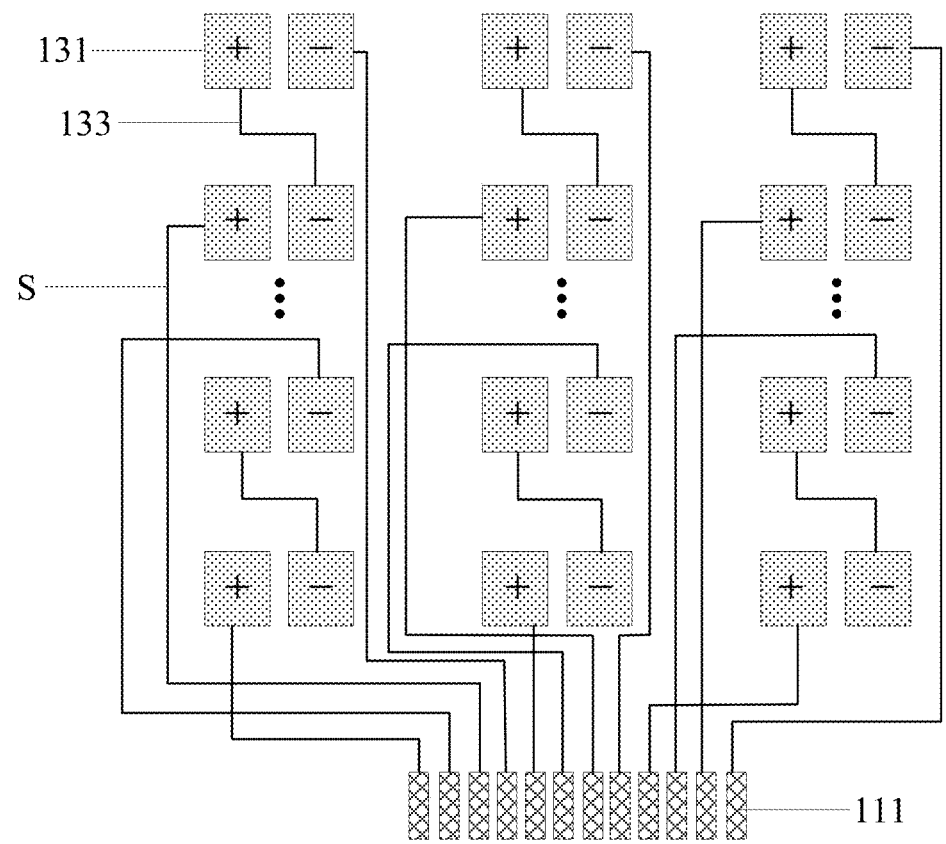
FIG. 1 illustrates a top view of a drive backboard according to some embodiments.
Figure 2:
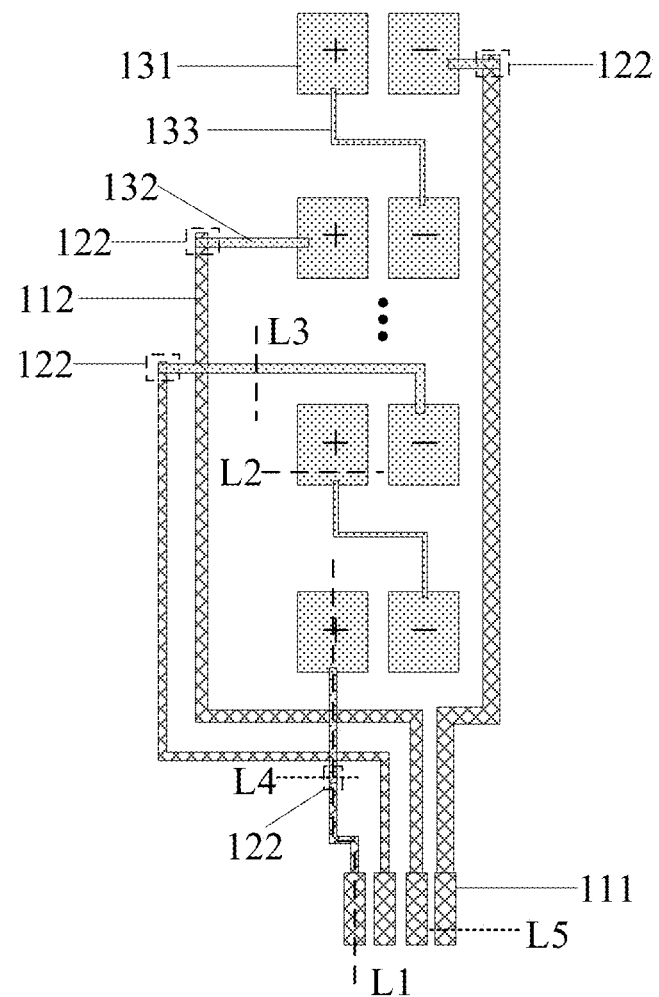
FIG. 2 illustrates a partially enlarged view of a portion of the drive backboard as shown in FIG. 1.
Figure 3:
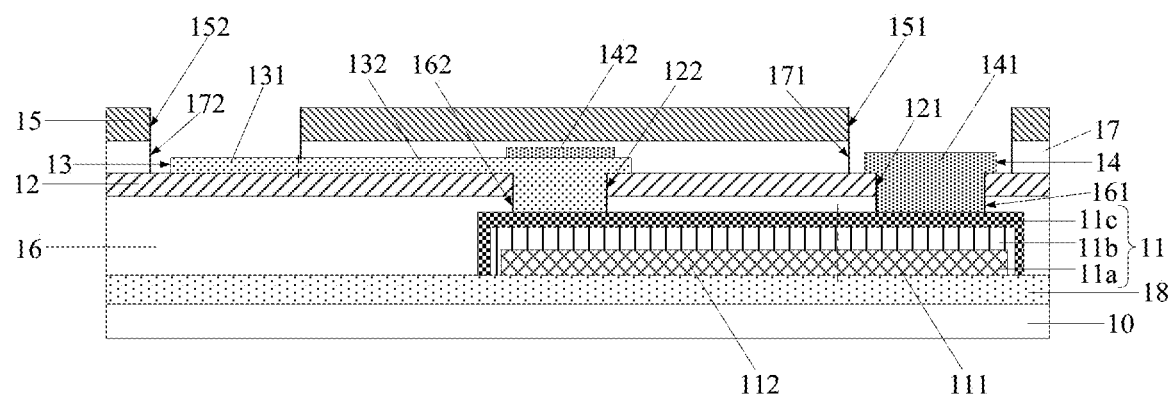
FIG. 3 illustrates a cross sectional view of a portion defined by line L1 shown in FIG. 2.
Figure 4:
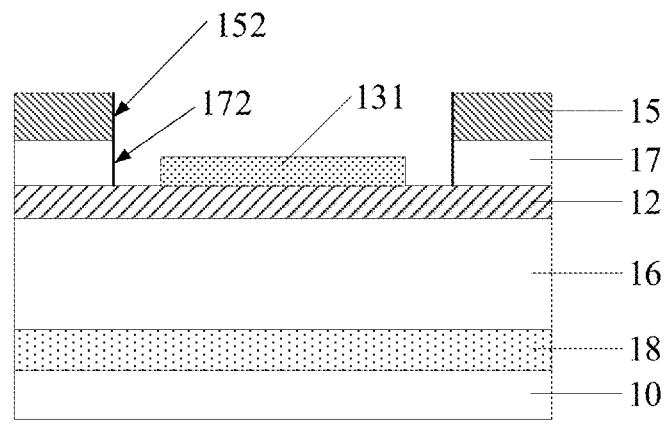
FIG. 4 illustrates a cross sectional view of a portion defined by line L2 shown in FIG. 2.
Figure 5:
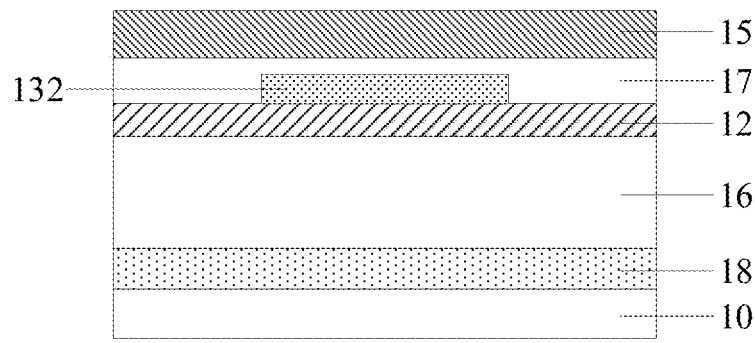
FIG. 5 illustrates a cross sectional view of a portion defined by line L3 shown in FIG. 2.
Figure 6:
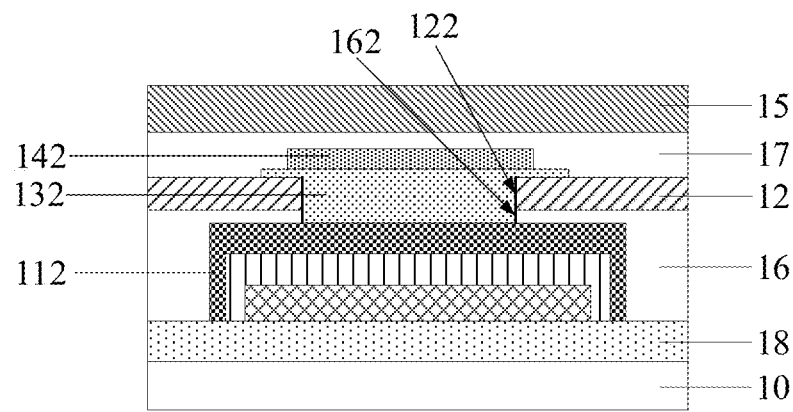
FIG. 6 illustrates a cross sectional view of a portion defined by line L4 shown in FIG. 2.
Figure 7:
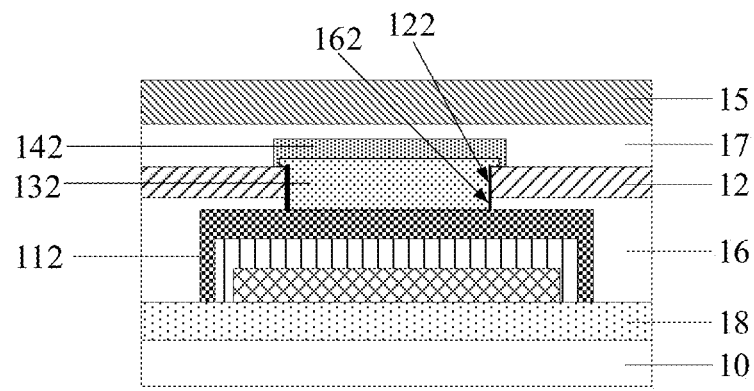
FIG. 7 illustrates another cross sectional view of a portion defined by line L4 shown in FIG. 2.
Figure 8:
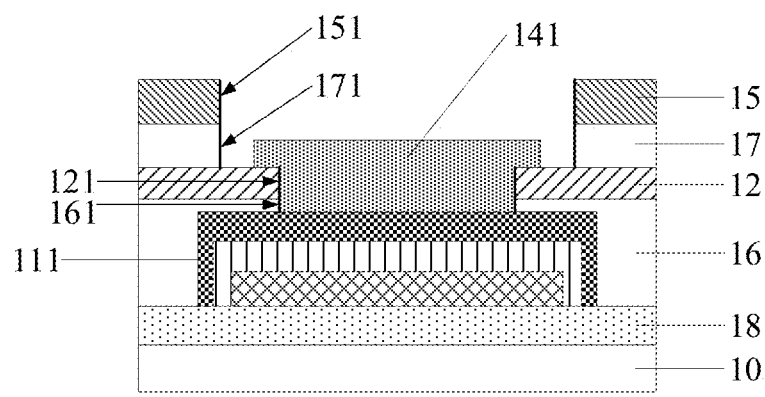
FIG. 8 illustrates a cross sectional view of a portion defined by line L5 shown in FIG. 2.

Embodiments of the disclosure provide a drive backboard. FIG. 1 is a top view of a drive backboard provided in embodiments of the disclosure, FIG. 2 is a partially enlarged view of a portion of a drive backboard as shown in FIG. 1, FIG. 3 is a cross sectional view of a portion defined by line L1 shown in in FIG. 2, FIG. 4 is a cross sectional view of a portion defined by line L2 shown in FIG. 2, FIG. 5 is a cross sectional view of a portion defined by line L3 shown in FIG. 2, FIG. 6 is a cross sectional view of a portion defined by line L4 shown in FIG. 2, FIG. 7 is another cross sectional view of a portion defined by line L4 shown in FIG. 2, and FIG. 8 is a cross sectional view of a portion defined by line L5 shown in FIG. 2. As shown in FIG. 1 to FIG. 8, the drive backboard provided in embodiments of the disclosure includes: a substrate 10, a first conductive layer 11 on the substrate 10, an insulating layer 12 on a side of the first conductive layer 11 facing away from the substrate 10, a second conductive layer 13 on a side of the insulating layer 12 facing away from the substrate 10, and a conductive protective layer 14 on a side of the second conductive layer 13 facing away from the substrate 10.

The first conductive layer 11 includes: a plurality of bonding pins 111, and a plurality of first connecting lines 112.

The insulating layer 12 includes: a plurality of first via holes 121, and a plurality of second via holes 122. The first via hole 121 exposes the bonding pin 111. One end of the first connecting line 112 is electrically connected with the bonding pin 111, and the other end reaches the second via hole 122.

The second conductive layer 13 includes: a plurality of connecting electrodes 131 and a plurality of second connecting lines 132. One end of the second connecting line 132 is electrically connected with the connecting electrode 131, and the other end is electrically connected with the first connecting line 112 through the second via hole 122.

The conductive protective layer 14 includes: a plurality of first protective structures 141 and a plurality of second protective structures 142; the first protective structure 141 covers the bonding pin 111 exposed by the first via hole 121, and the second protective structure 142 covers the second connecting line 112 located at the position of the second via hole 122.

The pattern of the conductive protective layer 14 is complementary to the pattern of the insulating layer 12.

In the drive backboard provided in embodiments of the disclosure, through providing a plurality of second protective structures in the conductive protective layer, the pattern of the conductive protective layer can be complementary to the pattern of the insulating layer. Thus, in the process of manufacturing the above drive backboard, the same mask can be adopted to pattern the insulating layer and the conductive protective layer, so as to save a mask and reduce the manufacturing cost. Moreover, the second protective structure can protect the second connecting line at the position of the second via hole, thereby preventing corrosion of the second connecting line in the subsequent manufacturing process.

As shown in FIG. 1, the above drive backboard in the embodiments of the disclosure includes: a plurality of bonding pins 111, a plurality of connecting electrodes 131 and a plurality of connecting lines S. The connecting electrode 131 electrically connects with the light emitting diode. The connecting electrode 131 marked with "+" in the figure can be electrically connected with the positive electrode of the light emitting diode, the connecting electrode 131 marked with "−" can be electrically connected with a negative electrode of the light emitting diode. The bonding pin 111 can be electrically connected with the driver chip, for example, the driver chip can be fixed onto a flexible circuit board, and the bonding pin 111 is electrically connected with the driver chip through the flexible circuit board. In some embodiments, the connecting electrode 131 can be electrically connected with the bonding pin 111 through the connecting line S, so as to control each light emitting diode to emit light through the driver chip. In some embodiments, the driver backboard provided in embodiments of the disclosure can be applied to a direct-lit backlighting module, or can also be applied to an edge-lit backlighting module, which is not defined herein.

In some embodiments, the light emitting diode in the backlight module can be arranged at the position corresponding to the pixel unit of the liquid crystal display panel.

In some embodiments, each pixel unit can correspond to at least one light emitting diode, for example, each light emitting diode in the backlight module is a white light emitting diode, then each pixel unit can correspond to 1-3 light emitting diodes; or the light emitting diodes in the backlight module are divided into a red light emitting diode, a green light emitting diode and a blue light emitting diode, which can be taken as a light emitting unit, and each pixel unit can correspond to 1-3 light emitting units. In some embodiments, each connecting electrode can be arranged at the corresponding position of the drive backboard according to the corresponding relationship between the light emitting diode and the pixel unit.

It can be obviously seen from FIG. 1 that, unavoidable intersection exists between different connecting lines S. To avoid intersection between different connecting lines S which may lead to incapability of the driver chip in controlling light emitting of the light emitting diode, referring to FIG. 2 and FIG. 3, the connecting lines S are divided into first connecting lines 112 in the first conductive layer 11 and second connecting lines 132 in the second conductive layer 13. In some embodiments, the first connecting line 112 electrically connects with the second connecting line 132 through the second via hole 122 in the insulating layer 12, thereby avoiding intersection between connecting lines and realize electrical connection between the bonding pin 111 and the connecting electrode 131. In some embodiments, the bonding pin 111 and the first connecting line 112 are arranged in the same layer, the connecting electrode 131 and the second connecting line 132 are arranged in the same layer. As such, only two conductive layers are needed to form the bonding pin, the connecting electrode and the connecting line, thereby reducing number of the conductive layers, reducing thickness of the drive backboard, simplifying process manufacturing steps, and saving manufacturing cost.

In some embodiments, the first conductive layer 11 and the second conductive layer 13 can adopt metal materials with favorable conductivity, for example, metallic copper can be adopted, and other metal materials with favorable conductivity can also be adopted, which is not defined herein. As such, the resistance of the connecting line S can be low.

In some embodiments, as shown in FIG. 3, a first via hole 121 which exposes the bonding pin 111 is arranged in the insulating layer 12. In the manufacturing process, the bonding pin 111 bonds with the flexible circuit board through conductive adhesive. In the bonding process, the conductive adhesive needs to be softened by baking at high temperature. To avoid poor contact caused when the bonding pin 111 is oxidized under high temperature, the conductive first protective structure 141 is provided to cover the bonding pin 111 exposed by the first via hole 121, similarly, a second protective structure 142 is provided to cover the second connecting line 112 at the position of the second via hole 122, thereby avoiding corrosion of the second connecting line 112 at the position of the second via hole 122. In some embodiments, the first protective structure 141 and the second protective structure 142 can be formed through patterning the conductive protective layer 14. That is to say, the first protective structure 141 and the second protective structure 142 are arranged in the same layer. In some embodiments, the conductive protective layer 14 can be manufactured by conductive materials, such as indium tin oxide (ITO), and other materials can also be adopted, which is not defined herein.

Figure 9:
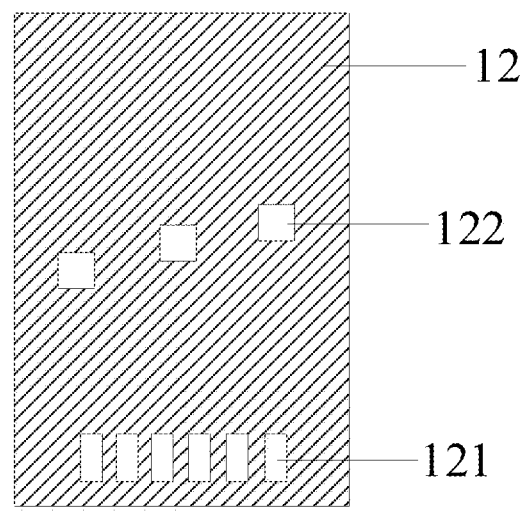
FIG. 9 illustrates is a top view of an insulating layer according to some embodiments.
Figure 10:
FIG. 10 illustrates a top view of a conductive protective layer according to some embodiments.

FIG. 9 is a top view of an insulating layer 12, and FIG. 10 is a top view of a conductive protective layer 14. As shown in FIG. 9, the insulating layer 12 includes a plurality of first via holes 121 and a plurality of second via holes 122. As shown in FIG. 10, the conductive protective layer 14 includes a plurality of first protective structures 141 and a plurality of second protective structures 142. It can be obviously seen from the comparison between FIG. 9 and FIG. 10 that, the pattern of the conductive protective layer 14 is complementary to the pattern of the insulating layer 12. That is, the position at which the insulating layer 12 is provided with a via hole corresponds to the position at which the conductive protective layer 14 is provided with a protective structure. In some embodiments, the position of the first protective structure 141 corresponds to the position of the first via hole 121, and the position of the second protective structure 142 corresponds to the position of the second via hole 122. It should be noted that, the size of the first protective structure 141 and the size of the first via hole 121 can be substantially equal, and can also have a certain deviation. Moreover, the size of the second protective structure 142 and the size of the second via hole 122 can be equal, and can also have a certain deviation.

Figure 11:
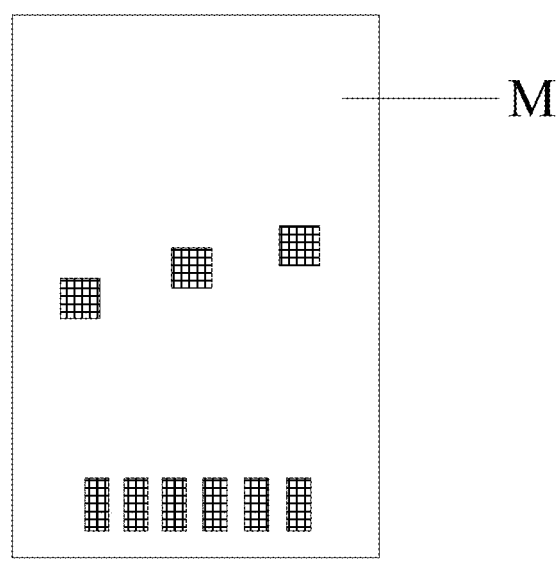
FIG. 11 illustrates a top view of a mask adopted in the patterning process of the insulating layer and the conductive protective layer according to some embodiments.

In some embodiments, in the manufacturing process, the same mask can be adopted to pattern the insulating layer 12 and the conductive protective layer 14. For example, the first mask M shown in FIG. 11 can be adopted to pattern the insulating layer 12 and the conductive protective layer 14, the black part in the figure is a light-shading area of the first mask M, while the remaining part is a light-transmitting area of the first mask M. In some embodiments, a mask with the pattern being complementary to the pattern of the first mask M shown in FIG. 11 can also be adopted, which is not defined herein. During actual process, photoresist materials with different photosensitivity can be adopted to pattern the insulating layer and the conductive protective layer, respectively. Since in the patterning process with the photoresist materials of different photosensitivity, a minor difference exists in the obtained patterns, therefore, the obtained pattern of the insulating layer and the obtained pattern of the conductive protective layer can be patterns which are complementary within a certain deviation range.

It should be noted that, for illustrating the relationship between the patterns of the insulating layer 12 and the conductive protective layer 14, only a limited number of first via holes 121 and second via holes 122 are taken as an example for illustration in FIG. 9, only a limited number of first protective structures 141 and second protective structures 142 are taken as an example for illustration in FIG. 10, and the number of the first via holes 121, the second via holes 122, the first protective structures 141 and the second protective structure 142 is not defined.

In some embodiments, as shown in FIG. 3, the above drive backboard provided in embodiments of the disclosure can further include: an insulating protective layer 15 on a side, facing away from the substrate 10, of the conductive protective layer 14.

The insulating protective layer 15 includes: a plurality of first openings 151 and a plurality of second openings 152.

The first opening 151 exposes the first protective structure 141, and the second opening 152 exposes the connecting electrode 131.

Through setting an insulating protective layer 15 on a side, facing away from the substrate 10, of the conductive protective layer 14, the drive backboard can play a role of protection. For example, the drive backboard can protect such structures as the second connecting line 132 and the second protective structure 142. Moreover, through setting a fifth via hole 151 in the insulating protective layer 15, the first protective structure 141 can be exposed, thereby facilitating electrical connection between the bonding pin 111 and the flexible circuit board. Through setting a sixth via hole 152 in the insulating protective layer 15, the connecting electrode 131 can be exposed, thereby facilitating electrical connection between the connecting electrode 131 and the light emitting diode.

In some embodiments, in the above drive backboard, as shown in FIG. 3, the insulating layer 12 and the insulating protective layer 15 are both organic film layers. For example, the insulating layer 12 and the insulating protective layer 15 can be manufactured with organic resin materials, and can also be manufactured with other organic materials, which is not defined herein.

In some embodiments, the above drive backboard can further include: a first inorganic layer 16 between the insulating layer 12 and the first conductive layer 11, and a second inorganic layer 17 between the insulating protective layer 15 and the conductive protective layer 14.

The first inorganic layer 16 includes: a plurality of third via holes 161 corresponding to the respective first via holes 121 respectively, and a plurality of fourth via holes 162 corresponding to the respective second via holes 122 respectively.

The second inorganic layer 17 includes: a plurality of fifth via holes 171 corresponding to each of the first openings 151 respectively, and a plurality of sixth via holes 172 corresponding to each of the second openings 152 respectively.

Through setting a first inorganic layer 16 on a side, towards the substrate 10, of the insulating layer 12, the first inorganic layer 16 has the function of blocking water vapor and oxygen, to improve the sealing performance of the drive backboard, and prevent erosion of water vapor and oxygen. Similarly, a second inorganic layer 17 is disposed on a side, towards the substrate 10, of the insulating protective layer 15, and the second inorganic layer 17 also has the function of blocking water vapor and oxygen, thereby further improving the sealing performance of the drive backboard. In some embodiments, the above first inorganic layer 15 and the second inorganic layer 17 can be formed with such inorganic materials as SiN or SiNO, and other inorganic materials can also be adopted, which is not defined herein.

In some embodiments, the thickness of the first conductive layer is generally within the range of 1-3 μm. Since the thickness of the first conductive layer is large, in the subsequent high-temperature process, the thermal expansion and contraction degree of the first conductive layer is different from that of the substrate, therefore, a stress will be generated between the first conductive layer and the substrate, which even makes the substrate be crushed. Therefore, in the above drive backboard provided in the embodiments of the disclosure, the total area of the pattern of the first conductive layer is less than or equal to 50% of the total area of the substrate. The stress between the first conductive layer and the substrate is controlled through controlling the total area of the pattern of the first conductive layer, thereby avoiding crushing of the substrate due to an overlarge stress.

In some embodiments, as shown in FIG. 3, the above drive backboard can further include an inorganic protective film 18 arranged between the substrate 10 and the first conductive layer 11, thereby further reducing the stress between the first conductive layer and the substrate, and preventing crushing of the substrate due to a large stress. In some embodiments, the inorganic protective film 18 can be formed with SiN materials and other inorganic materials, and can also be made of other inorganic materials, which is not defined herein.

In some embodiments, in the above drive backboard provided in the embodiments of the disclosure, as shown in FIG. 3, FIG. 6, FIG. 7 and FIG. 8, the first conductive layer 11 at least includes two conductive layers, such as 11a, 11b and 11c in the figures.

The pattern of the n-th sub-conductive layer covers edges of the pattern of the (n−1)th sub-conductive layer; the n-th sub-conductive layer is disposed on a side, facing away from the substrate, of the (n−1)th sub-conductive layer; and n is greater than or equal to 2.

For example, as shown in the figures, the pattern of the sub-conductive layer 11c covers the edges of the pattern of the sub-conductive layer 11b, and the pattern of the sub-conductive layer 11b covers the edges of the pattern of the sub-conductive layer 11a. The first conductive layer including three sub-conductive layers is taken as an example for illustration in the drawings of the embodiments of the disclosure. During specific implementation, the number of the sub-conductive layers in the first conductive layer can also be other numbers, which is not defined herein.

In the manufacturing process of the first conductive layer, an ion sputtering process is adopted to form a metal film on the substrate. Since energy in the ion sputtering process is high, if the formed metal film is too thick, the substrate cannot bear excessive energy and will be easily ruptured, therefore, the first conductive layer is set to at least include two sub-conductive layers. In the manufacturing process, through forming at least two sub-conductive layers, the thickness of the metal film formed during each ion sputtering process is reduced, thereby avoiding rupture of the substrate caused by excessive energy of the ion sputtering process. During specific implementation, the thickness of the first conductive layer needs to be within the range of 1-3 μm, the thickness of the sub-conductive layer can be set to be smaller than 1 μm, and the first conductive layer can generally include 2-3 sub-conductive layers.

In some embodiments, in the process of patterning the sub-conductive layer, a photoresist layer needs to be coated on the surface of the sub-conductive layer, through exposing and developing the photoresist layer, the photoresist layer only exposes the sub-conductive layer which needs to be etched, and then the sub-conductive layer is etched. In the etching process, the edge of the sub-conductive layer will not be etched fully, therefore, the sub-conductive layer formed later needs to wrap the edge of the sub-conductive layer formed earlier, such that the edge of the finally formed first conductive layer is favorable, and corrosion of the edge of the first conductive layer caused by poor edge in the high temperature environment in the subsequent process is avoided.

In some embodiments, in the above drive backboard provided in embodiments of the disclosure, as shown in FIG. 2, the line width of the first connecting line 112 electrically connected with the connecting electrode 131 is proportional to the distance between the connecting electrode 131 and the corresponding bonding pin 111. That is to say, the larger the distance between the connecting electrode 131 and the bonding pin 111, the larger the line width of the first connecting line 112 electrically connected with the connecting electrode 131. In this way, the resistance of each of the first connecting lines 112 can be equivalent, to facilitate simultaneous control of light emitting diodes of the near and far distances.

In some embodiments, in the above drive backboard, as shown in FIG. 1 and FIG. 2, the second conductive layer can further include a plurality of third connecting lines 133.

The plurality of connecting electrodes 131 in the second conductive layer is divided into first connecting electrodes (such as the connecting electrode 131 marked with "+" in the figure) and second connecting electrodes (such as the connecting electrode 131 marked with "−" in the figure). The first connecting electrode is electrically connected with the positive electrode of the light emitting diode, and the second connecting electrode is electrically connected with the negative electrode of the light emitting diode.

One end of the third connecting line 133 is connected with the first connecting electrode, and the other end is connected with the second connecting electrode. The first connecting electrode and the second connecting electrode connected via the same third connecting line 133 correspond to different light emitting diodes. As such, the light emitting diode can be connected in series.

In some embodiments, as shown in FIG. 1, only two light emitting diodes being connected in series is taken as an example to illustrate the top view of the drive backboard. During specific implementation, the number of the light emitting diodes in series connection can be determined according to actual conditions, which is not defined herein. Moreover, the third connecting line 133 is set to be in the same layer as the connecting electrode 131. Thus, in the manufacturing process, the third connecting line 133 and the connecting electrode 131 can be formed through the same patterning process, thereby saving the manufacturing cost.

In some embodiments, in the above drive backboard, as shown in FIG. 3 and FIG. 8, the orthographic projection of the first protective structure 141 on the substrate 10 covers the orthographic projection of the corresponding first via hole 121 on the substrate 10. As such, the first protective structure 141 completely covers the bonding pin 111 exposed by the first via hole 121, to prevent high-temperature oxidation of the bonding pin 111 in the subsequent process.

In some embodiments, as shown in FIG. 3 and FIG. 7, the orthographic projection of the second protective structure 142 on the substrate 10 covers the orthographic projection of the corresponding second via hole 122 on the substrate 10. As such, the second protective structure 142 can cover the first connecting line 112 at the position of the second via hole 122, and corrosion of the first connecting line 112 can be avoided. In some embodiments, the orthographic projection of the first connecting line 112 on the substrate 10 covers the orthographic projection of the second via hole 122 on the substrate 10, such that the first connecting line 112 completely fills the second via hole 122 without exposure of edge of the first connecting line 112, which otherwise may lead to corrosion of the edge of the first connecting line 112.

Based on the same disclosed concept, embodiments of the disclosure further provide a backlight module. Since the principle based on which the backlight module solves problems is similar to that of the above drive backboard, for the implementation of the backlight module, please refer to the implementation of the above drive backboard, and the repeated parts will not be repeated redundantly herein.

The backlight module provided in embodiments of the disclosure can include: a drive backboard according to any one of embodiments above, a plurality of light emitting diodes, and a driver chip.

The light emitting diode is electrically connected with the connecting electrode of the drive backboard; and the driver chip is electrically connected with the bonding pin of the drive backboard.

In some embodiments, the driver chip can be fixed onto the flexible circuit board, and the bonding pin is electrically connected with the driver chip through the flexible circuit board, thereby realizing electrical connection between the driver chip and the light emitting diode, and controlling each light emitting diode to emit light through the driver chip.

Based on the same disclosed concept, embodiments of the disclosure further provide a manufacturing method of the above drive backboard. The principle based on which the manufacturing method solves problems is similar to that of the above drive backboard, therefore, for the implementation of the manufacturing method, please refer to the implementation of the above drive backboard, and the repeated parts will not be repeated redundantly herein.

Figure 12:
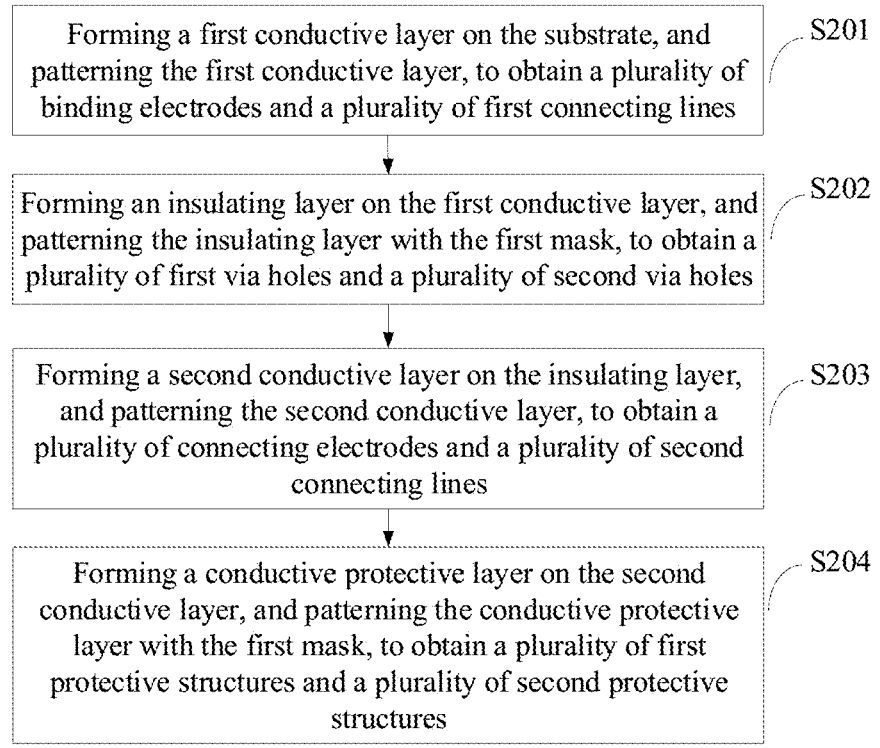
FIG. 12 illustrates a flow chart of a manufacturing method of the above drive backboard according to some embodiments.

As shown in FIG. 12, the manufacturing method of the above drive backboard provided in embodiments of the disclosure includes the following steps.

Figure 13:
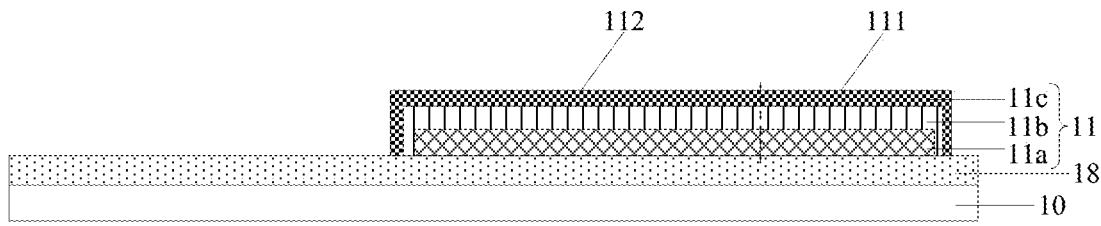
FIG. 13 illustrates an example of the manufacturing method when the bonding pins and first connecting lines are provided.

S201, forming a first conductive layer 11 on the substrate 10, and forming a plurality of bonding pins 111 and a plurality of first connecting lines 112 by patterning the first conductive layer 11, as shown in FIG. 13.

Figure 14:
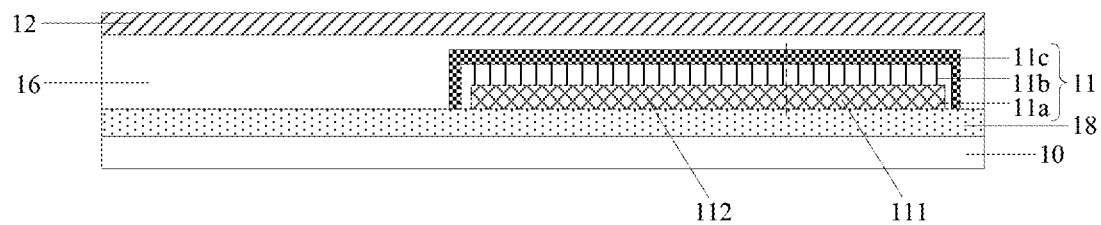
FIG. 14 illustrates an example of the manufacturing method when the insulating layer is provided.
Figure 15:
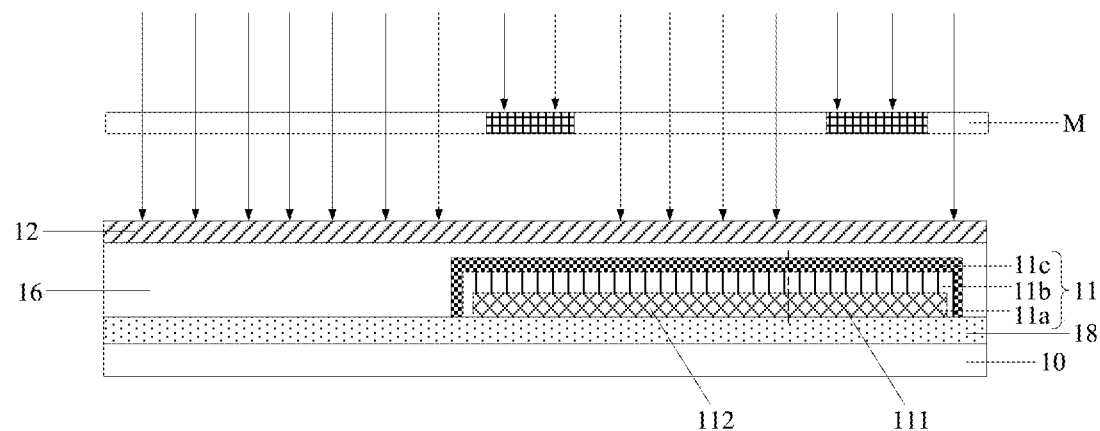
FIG. 15 illustrates an example of the manufacturing method when irradiating the insulating layer with the first mask.
Figure 17:
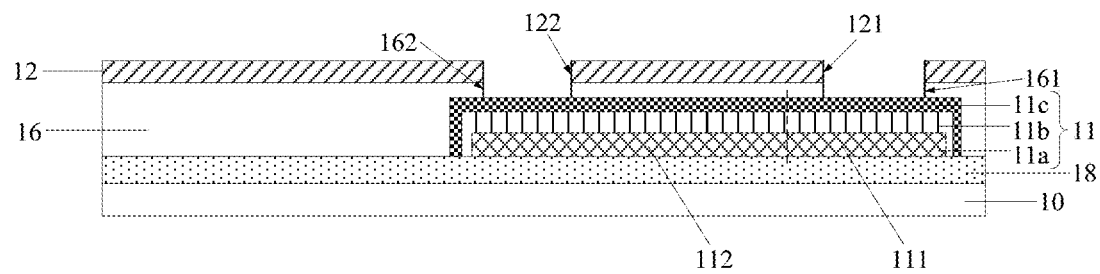
FIG. 17 illustrates another example of the manufacturing method when the first via holes and second via holes are provided.

S202, forming an insulating layer 12 on the first conductive layer 11, as shown in FIG. 14; patterning the insulating layer 12 with the first mask M, as shown in FIG. 15; and forming a plurality of first via holes 121 and a plurality of second via holes 122, as shown in FIG. 17.

Figure 18:
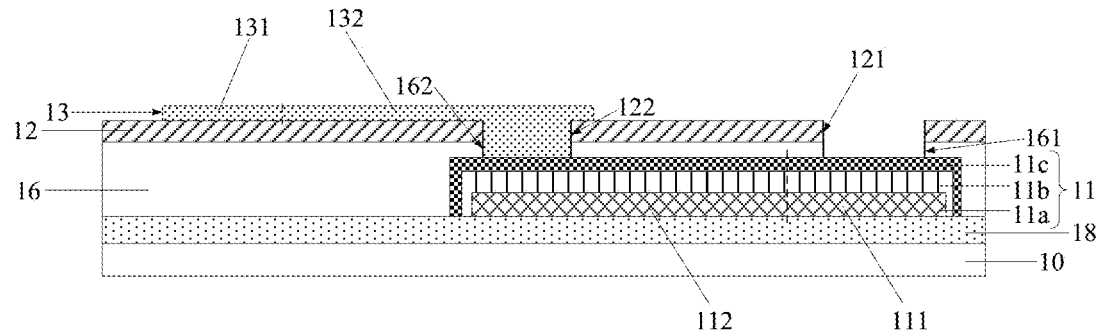
FIG. 18 illustrates an example of the manufacturing method when the connecting electrodes and second connecting lines are provided.

S203, forming a second conductive layer 13 on the insulating layer 12, and forming a plurality of connecting electrodes 131 and a plurality of second connecting lines 132 by patterning the second conductive layer 13, as shown in FIG. 18.

In some embodiments, an ion sputtering process is adopted to form the second conductive layer 13, and the material of the second conductive layer 13 can be metallic copper, and can also be other conductive materials, which is not defined herein.

Figure 19:
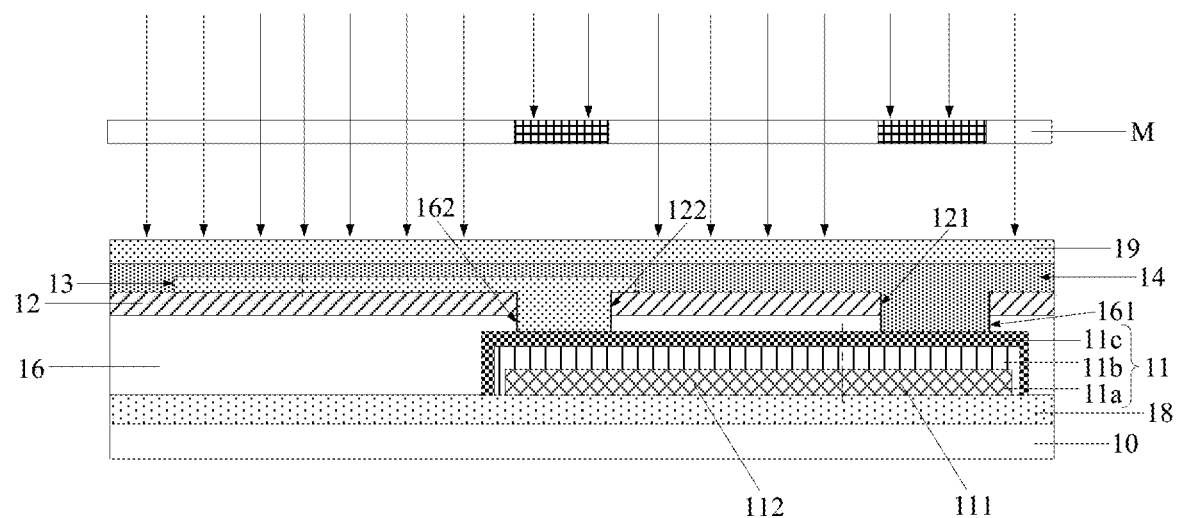
FIG. 19 illustrates an example of the manufacturing method when irradiating the conductive protective layer with the first mask.
Figure 21:
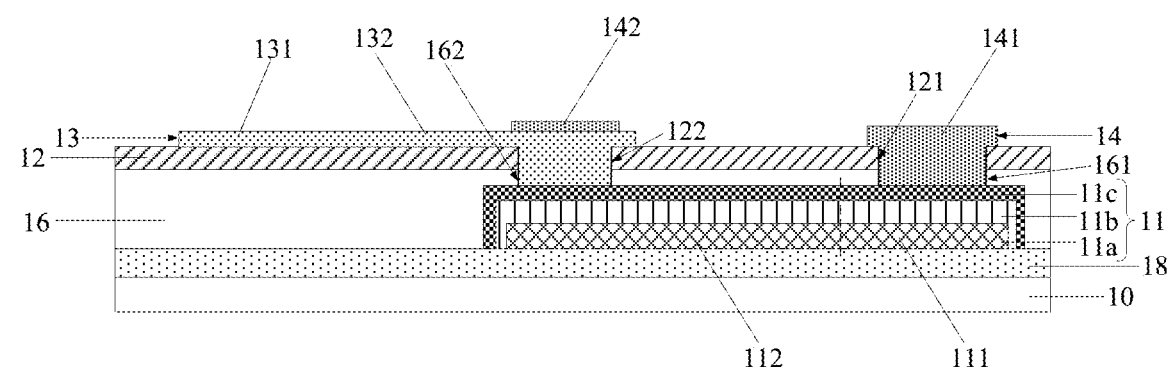
FIG. 21 illustrates an example of the manufacturing method when the first protective structures and second protective structures are provided.

S204, forming a conductive protective layer 14 on the second conductive layer 13, and patterning the conductive protective layer 14 with the first mask M, as show in in FIG. 19; forming a plurality of first protective structures 141 and a plurality of second protective structures 142, as shown in FIG. 21.

In the manufacturing method of the above drive backboard provided in embodiments of the disclosure, the mask which is the same as the mask used in the patterning of the insulating layer is adopted to pattern the conductive protective layer. As such, the number of masks used in the manufacturing process is reduced, and thus manufacturing cost and research and development costs can be reduced. Moreover, the formed second protective structure can protect the second connecting line at the position of the second via hole, and prevent corrosion of the second connecting line in the subsequent manufacturing process.

In the above S201, the first conductive layer 11 can include a plurality of sub-conductive layers which are arranged in a laminated manner. With the first conductive layer 11 as shown in FIG. 13 including three sub-conductive layers as an example, in some embodiments, an ion sputtering process can be adopted to form a sub-conductive layer 11a on the substrate 10, the material of the sub-conductive layer 11a can be metallic copper and can also be other conductive materials, which is not defined herein. A photoresist layer is formed on the sub-conductive layer 11a, to expose and develop the photoresist layer, such that the sub-conductive layer 11a which needs to be etched is exposed, while the sub-conductive layer 11a which does not need to be etched is covered by the photoresist layer, then the sub-conductive layer 11a is etched, and the pattern of the sub-conductive layer 11a is formed. The pattern of the sub-conductive layer 11b and the pattern of the sub-conductive layer 11c are respectively formed in the same manner as that for the sub-conductive layer 11a. In some embodiments, since the pattern of the n-th sub-conductive layer needs to cover the edge of the pattern of the (n–1)th sub-conductive layer, each of the sub-conductive layers needs to be patterned respectively by different masks.

In some embodiments, before the above S201, a layer of inorganic protective film 18 can be further formed on the substrate 10, so as to reduce the stress between the first conductive layer and the substrate, and prevent crushing of the substrate due to an overlarge stress.

Figure 16:
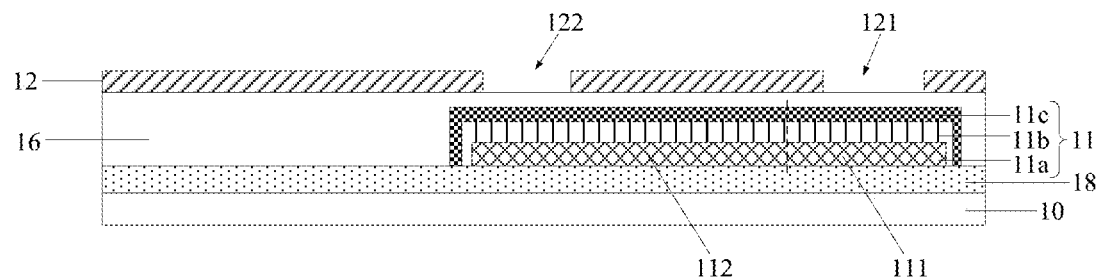
FIG. 16 illustrates an example of the manufacturing method when the first via holes and second via holes are provided.

In some embodiments, in the above manufacturing method provided in embodiments of the disclosure, the above S202 can include:

as shown in FIG. 14, forming an insulating layer 12 on the first conductive layer 11 with the first photoresist material; in some embodiments, a photosensitive resin material can be adopted; and as shown in FIG. 15, shielding the insulating layer 12 with the first mask M, exposing and developing the insulating layer 12, to obtain a plurality of first via holes 121 and a plurality of second via holes 122, as shown in FIG. 16.

In the embodiments of the disclosure, the insulating layer is formed directly with the first photoresist material, thus the patterns of the first via hole and the second via hole can be formed directly by exposure and development. A photoresist layer no longer needs to be coated, and the etching process is no longer required, therefore, the manufacturing process is further simplified, and the manufacturing cost is saved.

Figure 20:
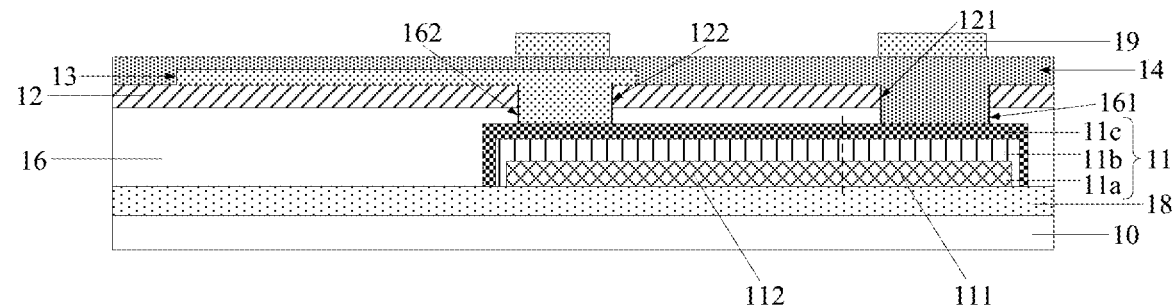
FIG. 20 illustrates an example of the manufacturing method when the pattern of the photoresist layer is provided.

In the above S204, the patterning of the conductive protective layer includes:

as shown in FIG. 19, forming a photoresist layer 19 on the conductive protective layer 14 with the second photoresist material, where the photosensitivity of the second photoresist material is opposite to that of the first photoresist material;

shielding the photoresist layer 19 with the first mask M, exposing and developing the photoresist layer 19, to obtain the pattern of the photoresist layer 19, as shown in FIG. 20;

etching the conductive protective layer 14, to obtain the patterns of the first protective structure 141 and the second protective structure 142, as shown in FIG. 21; and removing the photoresist layer 19.

In some embodiments, the first photoresist material in the above S202 is a positive photoresist material, and the second photoresist material in the above S204 is a negative photoresist material. In some embodiments, the first photoresist material in the above S202 is a negative photoresist material, and the second photoresist material in the above S204 is a positive photoresist material, which is not defined herein, as long as the photosensitivity of the first photoresist material is opposite to that of the second photoresist material.

With the first photoresist material being a negative photoresist material and the second photoresist material being a positive photoresist material as an example, as shown in FIG. 15, a first mask M is adopted to expose and develop the insulating layer 12. The arrow in the figure represents light rays in the exposure process, the insulating layer 12 irradiated by light will stay to form the pattern of the insulating layer 12; while as shown in FIG. 19, the first mask M is adopted to shield the photoresist layer 19, to expose and develop the photoresist layer 19, the arrow in the figure represents light rays in the exposure process, the photoresist layer 19 irradiated by light will be removed. When the conductive protective layer 14 is etched subsequently, the conductive protective layer 14 which is not shielded by the photoresist layer 19 will be etched, to form the patterns of the first protective structure 141 and the second protective structure 142. Through comparison between FIG. 15 and FIG. 19, it can be seen obviously that, in the process of patterning the insulating layer 12 and the conductive protective layer 14, the adopted masks are the same. In the actual process, the pattern of the positive photoresist layer after exposure and development is shaped like a regular trapezoid, and the pattern of the negative photoresist layer after exposure and development is shaped like an inverted trapezoid. Therefore, a certain size deviation exists between the pattern obtained from the patterning process performed with the positive photoresist layer and the pattern obtained from the patterning process performed with the negative photoresist layer. For example, the size difference is between 3 µm and 5 µm. Therefore, the certain deviation exists between the size of the pattern of the obtained insulating layer and the size of the pattern of the obtained conductive protective layer.

In some embodiments, since the insulating layer 12 is manufactured with organic materials, after the insulating layer 12 undergoes exposure and development processes, the obtained first via hole 121 and the second via hole 122 will be slightly smaller than the corresponding pattern on the first mask M; while the conductive protective layer 14 is manufactured by the inorganic material, a deviation between the pattern of the formed conductive protective layer 14 and the pattern on the first mask M is small. Therefore, in the above S204, through the spacing between the first mask M and the photoresist layer 19 and through adjusting the exposure amount in the exposure process, the pattern of the formed conductive protective layer 14 can be slightly greater than the pattern of the first mask M, to allow the size of the formed first protective structure 141 to be greater than the size of the first via hole 121, the size of the second protective structure 142 to be greater than the size of the second via hole 122. That is, the orthographic projection of the first protective structure 141 on the substrate 10 covers the orthographic projection of the corresponding first via hole 121 on the substrate 10, and the orthographic projection of the second protective structure 142 on the substrate 10 covers the orthographic projection of the corresponding second via hole 122 on the substrate 10.

In the embodiments of the disclosure, the insulating layer 12 being manufactured with the first photoresist material is taken as an example for illustration. In some embodiments, the insulating layer 12 can also be manufactured with other insulating materials. In the case that the insulating layer is manufactured with non-photosensitive materials and the insulating layer is patterned, the first photoresist material needs to be adopted to form a photoresist layer on the insulating layer, then the photoresist layer is shielded with the first mask, to expose and develop the photoresist layer, to obtain the pattern of the photoresist layer. The formed photoresist layer is then taken as a mask to etch the insulating layer, to form the pattern of the insulating layer. In the process of patterning the insulating layer 12 and the conductive protective layer 14, the same mask is adopted, and the photoresist layers with opposite photosensitivity are adopted, and the insulating layer 12 and the conductive protective layer 14 with the patterns being complementary to each other are formed.

In some embodiments, after the above S201 and before the above S202, the above manufacturing method provided in embodiments of the disclosure can further include:

as shown in FIG. 14, forming a first inorganic layer 16 on the first conductive layer 11; in some embodiments, the first inorganic layer 16 can be manufactured with SiN materials and can also be manufactured with other inorganic materials, which is not defined herein;

after the above S202, the above manufacturing method can further include:

as shown in FIG. 16, etching the first inorganic layer 16 with the pattern of the insulating layer 12 as a mask, to obtain a plurality of third via holes 161 and a plurality of fourth via holes 162, as shown in FIG. 17.

Since the pattern of the first inorganic layer 16 is consistent with the pattern of the insulating layer 12, in the manufacturing process, the pattern of the insulating layer 12 can be taken as a mask to etch the first inorganic layer 16, with no need of forming a photoresist layer above the first inorganic layer 16 to shield, thereby saving manufacturing cost.

In some embodiments, after the above S204, please refer to FIG. 3, a second inorganic layer 17 is formed on the conductive protective layer 14. In some embodiments, the second inorganic layer 17 can be manufactured with SiN or SiNO materials, and other inorganic materials can also be adopted, which is not defined herein. An insulating protective layer 15 is formed on the second inorganic layer 17, and the insulating protective layer 15 can also be manufactured with photosensitive materials. In some embodiments, the insulating protective layer 15 can be manufactured with resin material, to expose and develop the insulating protective layer 15 to obtain a pattern of the insulating protective layer 15, the pattern of the insulating protective layer 15 is taken as a mask to etch the second inorganic layer 17, to obtain the pattern of the second inorganic layer 17, that is, to obtain the structure as shown in FIG. 3.

As to the drive backboard, the manufacturing method thereof, the backlight module and the display device provided in embodiments of the disclosure, through arranging a plurality of second protective structures in the conductive protective layer, the pattern of the conductive protective layer can be complementary to the pattern of the insulating layer, therefore, in the process of manufacturing the above drive backboard, the same mask can be adopted to pattern the insulating layer and the conductive protective layer, so as to reduce the manufacturing cost. Moreover, the second protective structure can protect the second connecting line at the position of the second via hole, thereby preventing corrosion of the second connecting line in the subsequent manufacturing process.

Evidently, those skilled in the art can make various modifications and variations to the disclosure without departing from the spirit and scope of the disclosure. Accordingly, the disclosure is also intended to encompass these modifications and variations thereto so long as the modifications and variations come into the scope of the claims appended to the disclosure and their equivalents.

What is claimed is:

1. A drive backboard, comprising:
a substrate;
a first conductive layer on the substrate;
an insulating layer on a side, facing away from the substrate, of the first conductive layer;
a second conductive layer on a side, facing away from the substrate, of the insulating layer; and
a conductive protective layer on a side, facing away from the substrate, of the second conductive layer;
wherein
the first conductive layer comprises a plurality of bonding pins and a plurality of first connecting lines;
the insulating layer comprises a plurality of first via holes and a plurality of second via holes;
wherein the plurality of first via holes expose the plurality of bonding pins;
one end of a first connecting line is electrically connected with a bonding pin, and other end of the first connecting line reaches a second via hole;
the second conductive layer comprises a plurality of connecting electrodes and a plurality of second connecting lines;
wherein one end of a second connecting line is electrically connected with a connecting electrode, and other end of the second connecting line is electrically connected with the first connecting line through the second via hole;
the conductive protective layer comprises a plurality of first protective structures and a plurality of second protective structures;
wherein a first protective structure covers the bonding pin exposed by the first via hole, and the second protective structure covers the second connecting line formed at the position of the second via hole;
and
a pattern of the conductive protective layer is complementary to a pattern of the insulating layer.

2. The drive backboard according to claim 1, further comprising an insulating protective layer on a side, facing away from the substrate, of the conductive protective layer; wherein
the insulating protective layer comprises a plurality of first openings and a plurality of second openings; and
the plurality of first openings expose the plurality of first protective structures, and the plurality of second openings expose the plurality of connecting electrodes.

3. The drive backboard according to claim 2, wherein the insulating layer and the insulating protective layer are both organic film layers;
the drive backboard further comprises:
a first inorganic layer between the insulating layer and the first conductive layer; and
a second inorganic layer between the insulating protective layer and the conductive protective layer;
wherein the first inorganic layer comprises:
a plurality of third via holes corresponding to the plurality of first via holes respectively; and
a plurality of fourth via holes corresponding to the plurality of second via holes respectively;
and
wherein the second inorganic layer comprises:
a plurality of fifth via holes corresponding to the plurality of first openings respectively; and
a plurality of sixth via holes corresponding to the plurality of second openings respectively.

4. The drive backboard according to claim 1, wherein a total area of the pattern of the first conductive layer is less than or substantially equal to 50% of a total area of the substrate.

5. The drive backboard according to claim 4, further comprising: an inorganic protective film between the substrate and the first conductive layer.

6. The drive backboard according to claim 4, wherein the first conductive layer comprises at least two sub-conductive layers; and
a pattern of a n-th sub-conductive layer covers an edge of a pattern of a (n−1)th sub-conductive layer; and
the n-th sub-conductive layer is disposed on a side, facing away from the substrate, of the (n−1)th sub-conductive layer;
wherein n is greater than or equal to 2.

7. The drive backboard according to claim 1, wherein a line width of the first connecting line electrically connected with the connecting electrode is proportional to a distance between the connecting electrode and a corresponding bonding pin.

8. The drive backboard according to claim 1, wherein the second conductive layer further comprises a plurality of third connecting lines;
wherein
the plurality of connecting electrodes in the second conductive layer are divided into first connecting electrodes and second connecting electrodes;
wherein a first connecting electrode electrically connects with a positive electrode of a light emitting diode, and a second connecting electrode electrically connects with a negative electrode of the light emitting diode;
one end of a third connecting line is connected with the first connecting electrode, and other end of the third connecting line is connected with the second connecting electrode; and
the first connecting electrode and the second connecting electrode connected with a same third connecting line correspond to different light emitting diodes.

9. The drive backboard according to claim 1, wherein
an orthographic projection of the first protective structure on the substrate covers an orthographic projection of a corresponding first via hole on the substrate; and
an orthographic projection of the second protective structure on the substrate covers an orthographic projection of a corresponding second via hole on the substrate.

10. A backlight module, comprising: a drive backboard, a plurality of light emitting diodes, and a driver chip;
wherein the drive backboard comprises:
a substrate;
a first conductive layer on the substrate;
an insulating layer on a side, facing away from the substrate, of the first conductive layer;
a second conductive layer on a side, facing away from the substrate, of the insulating layer; and
a conductive protective layer on a side, facing away from the substrate, of the second conductive layer;
wherein
the first conductive layer comprises a plurality of bonding pins and a plurality of first connecting lines;
the insulating layer comprises a plurality of first via holes and a plurality of second via holes;
wherein the plurality of first via holes expose the plurality of bonding pins;
one end of a first connecting line is electrically connected with a bonding pin, and other end of the first connecting line reaches a second via hole;
the second conductive layer comprises a plurality of connecting electrodes and a plurality of second connecting lines;
wherein one end of a second connecting line is electrically connected with a connecting electrode, and other end of the second connecting line is electrically connected with the first connecting line through the second via hole;
the conductive protective layer comprises a plurality of first protective structures and a plurality of second protective structures;
wherein a first protective structure covers the bonding pin exposed by the first via hole, and the second protective structure covers the second connecting line formed at the position of the second via hole;
and
a pattern of the conductive protective layer is complementary to a pattern of the insulating layer;
the plurality of light emitting diodes are electrically connected with the plurality of connecting electrodes of the drive backboard; and
the driver chip is electrically connected with the plurality of bonding pins of the drive backboard.

11. The backlight module according to claim 10, wherein the drive backboard further comprises:
an insulating protective layer on a side, facing away from the substrate, of the conductive protective layer;
wherein
the insulating protective layer comprises a plurality of first openings and a plurality of second openings; and
the plurality of first openings expose the plurality of first protective structures, and the plurality of second openings expose the plurality of connecting electrodes.

12. The backlight module according to claim 11, wherein the insulating layer and the insulating protective layer are both organic film layers;
the drive backboard further comprises:
a first inorganic layer between the insulating layer and the first conductive layer; and
a second inorganic layer between the insulating protective layer and the conductive protective layer;
wherein the first inorganic layer comprises:
a plurality of third via holes corresponding to the plurality of first via holes respectively; and
a plurality of fourth via holes corresponding to the plurality of second via holes respectively;
and
wherein the second inorganic layer comprises:
a plurality of fifth via holes corresponding to the plurality of first openings respectively; and
a plurality of sixth via holes corresponding to the plurality of second openings respectively.

13. The backlight module according to claim 10, wherein a total area of the pattern of the first conductive layer is less than or substantially equal to 50% of a total area of the substrate.

14. The backlight module according to claim 13, wherein the drive backboard further comprises: an inorganic protective film between the substrate and the first conductive layer.

15. The backlight module according to claim 13, wherein the first conductive layer comprises at least two sub-conductive layers; and
a pattern of a n-th sub-conductive layer covers an edge of a pattern of a (n−1)th sub-conductive layer; and the n-th sub-conductive layer is disposed on a side, facing away from the substrate, of the (n−1)th sub-conductive layer;

wherein n is greater than or equal to 2.

16. The backlight module according to claim 10, wherein a line width of the first connecting line electrically connected with the connecting electrode is proportional to a distance between the connecting electrode and a corresponding bonding pin.

17. The backlight module according to claim 10, wherein the second conductive layer further comprises a plurality of third connecting lines;

wherein
the plurality of connecting electrodes in the second conductive layer are divided into first connecting electrodes and second connecting electrodes;
wherein a first connecting electrode electrically connects with a positive electrode of a light emitting diode, and a second connecting electrode electrically connects with a negative electrode of the light emitting diode;
one end of a third connecting line is connected with the first connecting electrode, and other end of the third connecting line is connected with the second connecting electrode; and
the first connecting electrode and the second connecting electrode connected with a same third connecting line correspond to different light emitting diodes.

18. The backlight module according to claim 10, wherein an orthographic projection of the first protective structure on the substrate covers an orthographic projection of a corresponding first via hole on the substrate; and an orthographic projection of the second protective structure on the substrate covers an orthographic projection of a corresponding second via hole on the substrate.

19. A manufacturing method of a drive backboard according to claim 1, comprising:

forming the first conductive layer on the substrate;

patterning the first conductive layer, to obtain a plurality of binding electrodes and a plurality of first connecting lines;

forming an insulating layer on the first conductive layer;

patterning the insulating layer with a first mask, to obtain a plurality of first via holes and a plurality of second via holes;

forming a second conductive layer on the insulating layer;

patterning the second conductive layer, to obtain a plurality of connecting electrodes and a plurality of second connecting lines;

forming a conductive protective layer on the second conductive layer; and patterning the conductive protective layer with the first mask, to obtain a plurality of first protective structures and a plurality of second protective structures.

20. The manufacturing method according to claim 19, wherein forming an insulating layer on the first conductive layer and patterning the insulating layer with a first mask comprises:
forming the insulating layer on the first conductive layer with a first photoresist material; and
exposing and developing the insulating layer by shielding the insulating layer with the first mask;
wherein patterning the conductive protective layer with a first mask comprises:
forming the photoresist layer on the conductive protective layer with a second photoresist material, wherein photosensitivity of the second photoresist material is opposite to photosensitivity of the first photoresist material;
exposing and developing the photoresist layer by shielding the photoresist layer with the first mask;
etching the conductive protective layer; and
removing the photoresist layer.

\* \* \* \* \*